United States Patent
Kim et al.

(10) Patent No.: US 8,305,819 B2
(45) Date of Patent: Nov. 6, 2012

(54) DATA OUTPUT CIRCUIT OF SEMICONDUCTOR MEMORY DEVICE

(75) Inventors: Kwang-Hyun Kim, Gyeonggi-do (KR); Kang-Youl Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 401 days.

(21) Appl. No.: 12/751,425

(22) Filed: Mar. 31, 2010

(65) Prior Publication Data
US 2011/0216606 A1 Sep. 8, 2011

(30) Foreign Application Priority Data

Mar. 8, 2010 (KR) .................. 10-2010-0020437

(51) Int. Cl.
*G11C 7/10* (2006.01)

(52) U.S. Cl. .................. 365/189.05; 365/191; 365/198

(58) Field of Classification Search .................. None
See application file for complete search history.

(56) References Cited

U.S. PATENT DOCUMENTS

| | | | |
|---|---|---|---|
| 7,212,449 B2* | 5/2007 | Lee | 365/189.05 |
| 7,355,899 B2* | 4/2008 | Shin | 365/189.02 |
| 7,420,865 B2* | 9/2008 | Lee | 365/219 |
| 7,818,526 B2* | 10/2010 | Jang et al. | 711/167 |
| 7,995,422 B2* | 8/2011 | Kim | 365/233.18 |

FOREIGN PATENT DOCUMENTS

| | | |
|---|---|---|
| KR | 1020060071977 | 6/2006 |
| KR | 100654125 | 12/2006 |

OTHER PUBLICATIONS

Notice of Allowance issued from Korean Intellectual Property Office on Aug. 30, 2011.
Notice of Preliminary Rejection issued from Korean Intellectual Property Office on Jun. 28, 2011.

* cited by examiner

*Primary Examiner* — Alexander Sofocleous
(74) *Attorney, Agent, or Firm* — IP & T Group LLP

(57) ABSTRACT

A data output circuit of a semiconductor memory device includes a pipe latch unit configured to store input parallel data and align the stored data in response to a plurality of alignment control signals to output serial output data, and an alignment control signal generating unit configured to generate the plurality of alignment control signals in response to a burst-type information and a seed address group, wherein the alignment control signal generating unit generates the alignment control signals to swap data in a swap mode where the burst-type is a certain type and bits of the seed address group are certain values.

25 Claims, 12 Drawing Sheets

FIG. 5A

| (A2, A1) | | T0 | T1 | T2 | T3 |
|---|---|---|---|---|---|
| INT OR A0='L' RISING | S0 | P0 | P1 | P2 | P3 |
| | S1 | P1 | P0 | P3 | P2 |
| | S2 | P2 | P3 | P0 | P1 |
| | S3 | P3 | P2 | P1 | P0 |
| (A2, A1) | | T0 | T1 | T2 | T3 |
| INT OR A0='L' FALLING | S0 | P0 | P1 | P2 | P3 |
| | S1 | P1 | P0 | P3 | P2 |
| | S2 | P2 | P3 | P0 | P1 |
| | S3 | P3 | P2 | P1 | P0 |
| (A2, A1) | | T0 | T1 | T2 | T3 |
| SEQ AND A0='H' RISING | S0 | P0 | P1 | P2 | P3 |
| | S1 | P1 | P0 | P3 | P2 |
| | S2 | P2 | P3 | P0 | P1 |
| | S3 | P3 | P2 | P1 | P0 |
| (A2, A1) | | T0 | T1 | T2 | T3 |
| SEQ AND A0='H' FALLING | S0 | P1 | P0 | P3 | P2 |
| | S1 | P0 | P1 | P2 | P3 |
| | S2 | P3 | P2 | P1 | P0 |
| | S3 | P2 | P3 | P0 | P1 |

| S0 | T0 | T1 | T2 | T3 |
|----|----|----|----|----|
| P0 | 1  | 0  | 0  | 0  |
| P1 | 0  | 1  | 0  | 0  |
| P2 | 0  | 0  | 1  | 0  |
| P3 | 0  | 0  | 0  | 1  |

| S1 | T0 | T1 | T2 | T3 |
|----|----|----|----|----|
| P0 | 0  | 1  | 0  | 0  |
| P1 | 1  | 0  | 0  | 0  |
| P2 | 0  | 0  | 0  | 1  |
| P3 | 0  | 0  | 1  | 0  |

| S2 | T0 | T1 | T2 | T3 |
|----|----|----|----|----|
| P0 | 0  | 0  | 1  | 0  |
| P1 | 0  | 0  | 0  | 1  |
| P2 | 1  | 0  | 0  | 0  |
| P3 | 0  | 1  | 0  | 0  |

| S3 | T0 | T1 | T2 | T3 |
|----|----|----|----|----|
| P0 | 0  | 0  | 0  | 1  |
| P1 | 0  | 0  | 1  | 0  |
| P2 | 0  | 1  | 0  | 0  |
| P3 | 1  | 0  | 0  | 0  | though $2011 - 0000 Apply Name$

DATA OUTPUT CIRCUIT OF SEMICONDUCTOR MEMORY DEVICE

CROSS-REFERENCE TO RELATED APPLICATIONS

The present application claims priority of Korean Patent Application No. 10-2010-0020437, filed on Mar. 8, 2010, which is incorporated herein by reference in its entirety.

BACKGROUND OF THE INVENTION

Exemplary embodiments of the present invention relate to a semiconductor memory device, and more particularly, to a data output circuit of a semiconductor memory device.

In general, a data input/output of a synchronous semiconductor memory device is operated in synchronism with an internal clock signal generated on the basis of an external clock signal. Such a synchronous semiconductor memory device may be an SDR (Single Data Rate) SDRAM (Synchronous Dynamic Random Access Memory), which outputs data in synchronism with a rising edge of the internal clock signal. Alternatively, the synchronous semiconductor memory device may be a DDR (Double Data Rate) SDRAM, a DDR2 SDRAM, or a DDR3 SDRAM, which output data in synchronism with rising and falling edges of the internal clock signal.

A DDR3 SDRAM generally uses an 8-bit pre-fetch scheme. The 8-bit pre-fetch scheme is a method that, in the event that a read command is once generated inside of a semiconductor memory device, outputs 8-bit data in parallel from a memory cell array and then outputs the 8-bit data in series to an external device through one data input/output pin during 2 clock cycles.

A data output circuit of a known synchronous semiconductor memory device may include an alignment control signal generating unit and a pipe latch unit.

The alignment control signal generating unit may generate even alignment control signals SOSEB1_R and SOSEB2_R, and odd alignment control signals SOSEB1_F and SOSEB2_F in response to a column address applied with a read command during a read operation. The pipe latch unit may store 8-bit parallel data GIO<0:7> input from banks, and then may align the stored data in response to the even alignment control signals SOSEB1_R and SOSEB2_R, and the odd alignment control signals SOSEB1_F and SOSEB2_F, thereby outputting the aligned data in series.

For reference, the odd alignment control signals SOSEB1_F and SOSEB2_F may be generated by delaying the even alignment control signals SOSEB1_R and SOSEB2_R or inverted signals of the even alignment control signals SOSEB1_R and SOSEB2_R by a half clock of the internal clock signal.

Further, the pipe latch unit may include an even data alignment unit and an odd data alignment unit to determine a read burst order. The even data alignment unit may align the parallel data in response to the even alignment control signals SOSEB1_R and SOSEB2_R to output a first alignment-output data, and the odd data alignment unit may align the parallel data in response to the odd alignment control signals SOSEB1_F and SOSEB2_F to output a second alignment-output data.

FIG. 1 illustrates a circuit diagram of an even data alignment unit in a data output circuit of a known synchronous semiconductor memory device.

For reference, since a circuit configuration of the odd data alignment unit is substantially the same as the even data alignment unit except for input signals, its detailed description will be omitted for conciseness.

The even data alignment unit 10 includes a first-stage multiplexer 12 and a second-stage multiplexer 14 to perform a 2-step multiplexing operation. The first-stage multiplexer 12 selects one of even data DO01R and even data D023R, and one of even data D045R and even data DO67R in response to a first even alignment control signal SOSEB1_R. The second-stage multiplexer 14 selects one of outputs of the first-stage multiplexer 12 in response to a second even alignment control signal SOSEB2_R to output a first alignment-output data ARDO.

As described above, a known pipe latch unit may perform the 2-step multiplexing operation by sequentially controlling the first-stage multiplexer 12 and the second-stage multiplexer 14 in response to the even alignment control signals SOSEB1_R and SOSEB2_R or the odd alignment control signals SOSEB1_F and SOSEB2_F. As a result, the known pipe latch unit can determine a read burst order of output data. However, the likelihood of an asynchronous path is increased due to the above 2-step multiplexing operation, and this affects a column address access time ("tAA"), which is a performance factor representing the speed of data to be outputted from a read command. Furthermore, since each of the even and odd data alignment units is composed of the 2-stage multiplexer, a skew may occur due to the increased likelihood of an asynchronous path.

SUMMARY OF THE INVENTION

Exemplary embodiments of the present invention are directed to a data output circuit of a semiconductor memory device, capable of reducing/minimizing the likelihood of an asynchronous path and a skew thereof by implementing a data alignment unit for determining a read burst order with a 1-stage multiplexer. As a result, it is possible to prevent a synchronous memory device from malfunctioning by improving a tAA.

Further, other exemplary embodiments of the present invention are directed to a data output circuit of a semiconductor memory device, capable of improving a data transfer rate by simplifying a structure of a data alignment unit and reducing/minimizing the stage-number of gates thereof.

Still other exemplary embodiments of the present invention are directed to a data output circuit of a semiconductor memory device, capable of improving a tCK margin by implementing an alignment signal generating unit with plural flip-flops.

In accordance with an embodiment of the present invention, a data output circuit of a semiconductor memory device includes a pipe latch unit configured to store input parallel data and align the stored data in response to a plurality of alignment control signals to output serial output data, and an alignment control signal generating unit configured to generate the plurality of alignment control signals in response to a burst-type information and a seed address group, wherein the alignment control signal generating unit generates the alignment control signals to swap data in a swap mode where the burst-type is a certain type and bits of the seed address group are certain values.

The pipe latch unit may comprise a multiplexing unit including a plurality of unit multiplexers whose number corresponds to the number of the alignment control signals.

The unit multiplexers may be coupled in parallel to form the multiplexing unit with 1-stage.

In accordance with another embodiment of the present invention, a data output circuit of a semiconductor memory device includes a pipe latch unit configured to store input parallel data, and align even data of the stored data in response to a plurality of even alignment control signals to output a first output data, and align odd data of the stored data in response to a plurality of odd alignment control signals to output a second output data, and an alignment control signal generating unit configured to generate the plurality of even and odd alignment control signals in response to a burst-type information and a seed address group, wherein the alignment control signal generating unit outputs the even alignment control signals as the odd alignment control signals in a normal mode, and outputs the odd alignment control signals by swapping even alignment control signals in a swap mode.

In accordance with yet another embodiment of the present invention, a data output circuit of a semiconductor memory device includes a pipe latch output control unit configured to generates a pipe latch output control signal in response to a read column access strobe (CAS) signal, which is set by a read command, an alignment control signal generating unit configured to generate a plurality of alignment control signals for swapping data in a swap mode detected in response to a burst-type information and a seed address group, a pipe latch unit configured to store input parallel data and align the stored data in response to the plurality of alignment control signals to output serial output data, and a data driving unit configured to output the serial output data of the pipe latch unit in synchronism with a clock signal.

BRIEF DESCRIPTION OF THE DRAWINGS

FIGS. 5A and 5B are diagrams illustrating alignment control signals shown in FIGS. 4A and 4B, which are generated in response to a seed address.

DESCRIPTION OF SPECIFIC EMBODIMENTS

Figure 1:
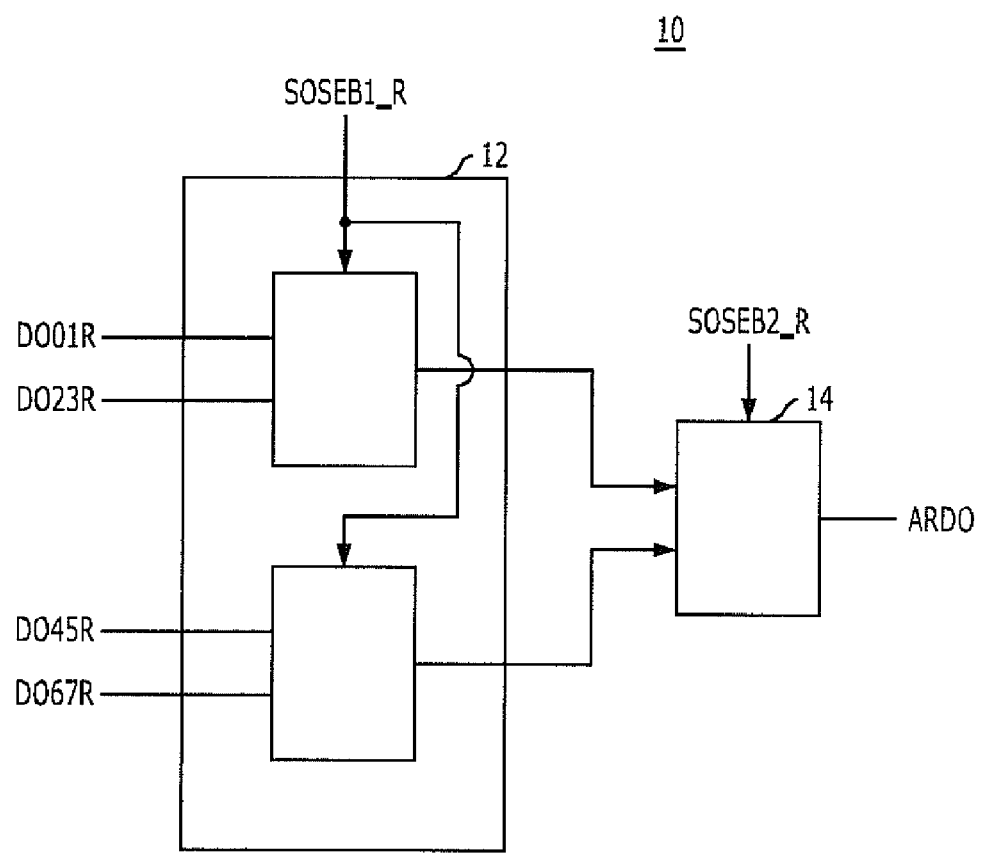
FIG. 1 illustrates a circuit diagram of an even data alignment unit in a data output circuit of a known synchronous semiconductor memory device.

Exemplary embodiments of the present invention are described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawing figures and embodiments of the present invention.

Figure 2:
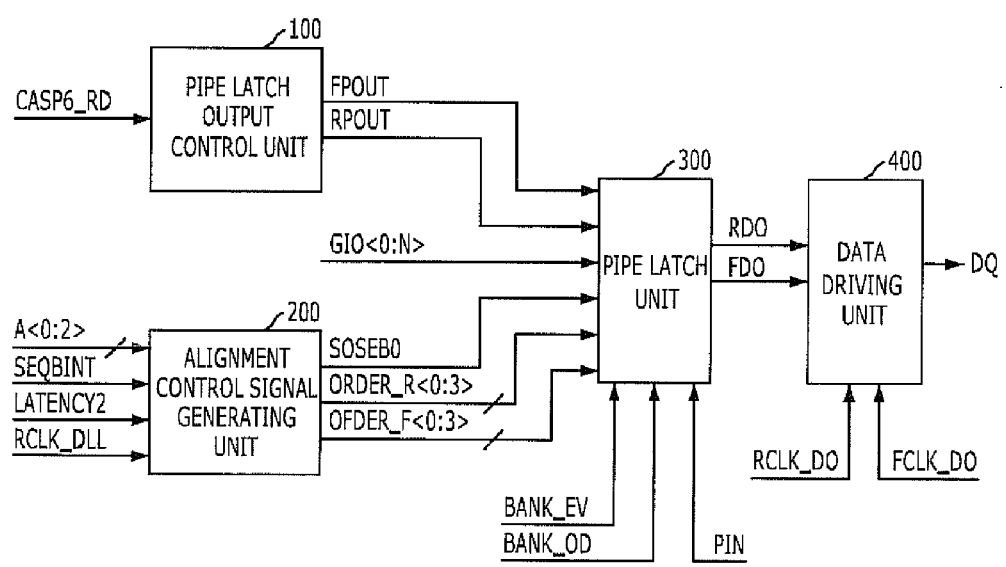
FIG. 2 illustrates a block diagram of a data output circuit of a synchronous semiconductor memory device in accordance with an embodiment of the present invention.

FIG. 2 illustrates a block diagram of a data output circuit of a synchronous semiconductor memory device in accordance with an embodiment of the present invention.

As shown, the data output circuit of the synchronous semiconductor memory device in accordance with an exemplary embodiment includes a pipe latch output control unit 100, an alignment control signal generating unit 200, a pipe latch unit 300, and a data driving unit 400.

The pipe latch output control unit 100 is configured to generate first and second pipe latch output control signals FPOUT and RPOUT in response to a read column access strobe (CAS) signal CASP6_RD, which is set by a read command.

The alignment control signal generating unit 200 is configured to receive a seed address group A<0:2> to generate a selection signal SOSEB0, an even alignment control signal group ORDER_R<0:3>, and an odd alignment control signal group ORDER_F<0:3> in response to a burst-type selection signal SEQBINT, a CAS latency signal LATENCY2, and a DLL rising clock signal RCLK_DLL.

Here, the seed address group A<0:2> may be composed from the 3 least significant bits of a column address supplied with a read command during a read operation. The alignment control signal generating unit 200 decodes a first seed address A<0> to generate the selection signal SOSEB0, and decodes second and third seed addresses A<1:2> to generate the even alignment control signal group ORDER_R<0:3> and the odd alignment control signal group ORDER_F<0:3>. Herein, for example, A<0:2> includes A<0>, which corresponds to the least significant bit, A<1>, which corresponds to the middle significant bit, and A<2>, which corresponds to the most significant bit. Thus, for example, where A<0:2> is '011', A<0> is the least significant bit '1', A<1> is the middle significant bit '1', and A<2> is the most significant bit '0'.

The pipe latch unit 300 is configured to store (N+1)-bit parallel data GIO<0:N> (where 'N' is a positive integer) of a corresponding bank in response to a pipe latch input control signal PIN and bank information signals BANK_EV and BANK_OD, to align the stored data in response to the selection signal SOSEB0 and the even and odd alignment control signal groups ORDER_R<0:3> and ORDER_F<0:3>, and to output first and second pipe-output data RDO and FDO in series in response to the first and second pipe latch output control signals FPOUT and RPOUT. Herein, for example, 'N' is 7, and thus, the pipe latch unit 300 is configured to store 8-bit parallel data GIO<0:7> of a corresponding bank.

The data driving unit 400 is configured to output the first and second pipe-output data RDO and FDO as output data DQ in synchronism with a corresponding one of output clock signals RCLK_DO and FCLK_DO.

Figure 3:
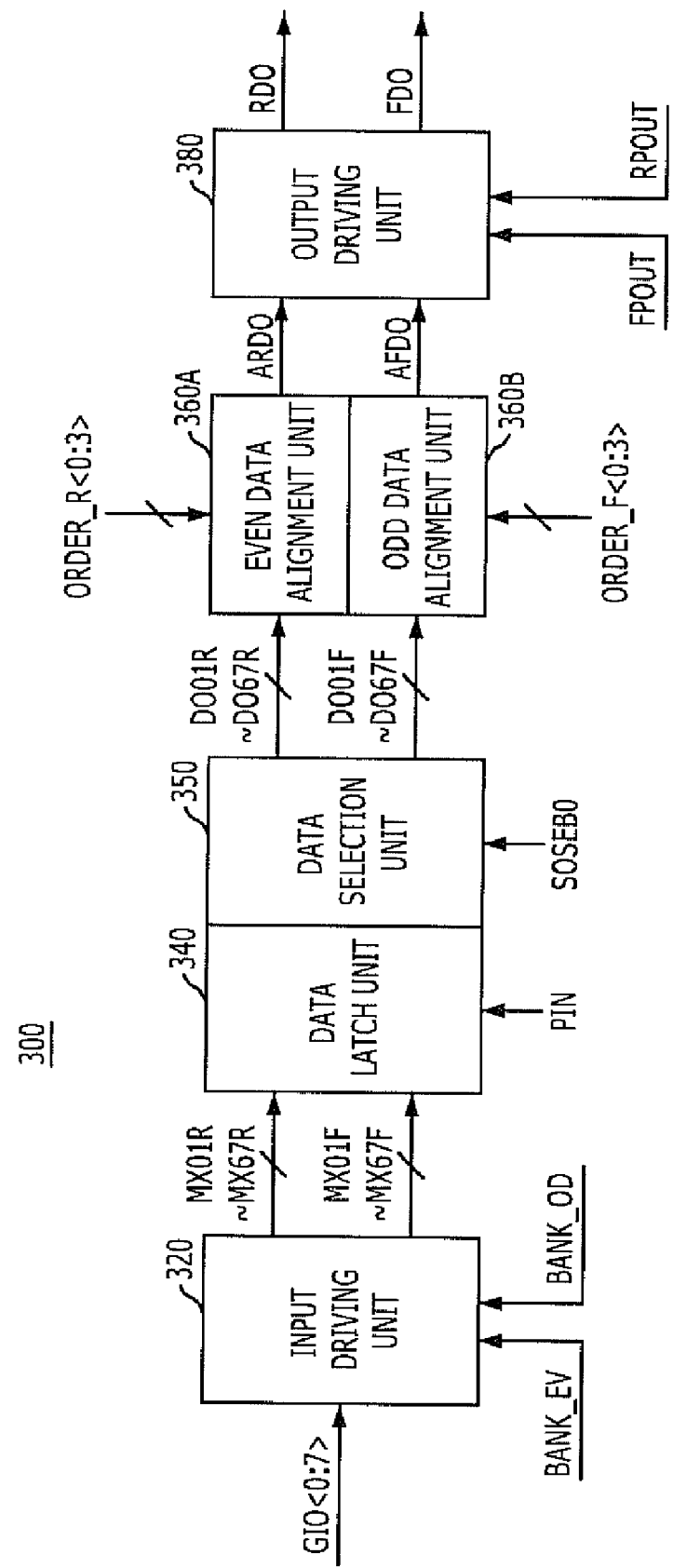
FIG. 3 illustrates a block diagram of a pipe latch unit shown in FIG. 2.

FIG. 3 illustrates a block diagram of the pipe latch unit 300 shown in FIG. 2.

As shown, the pipe latch unit 300 includes an input driving unit 320, a data latch unit 340, a data selection unit 350, a data alignment unit 360, and an output driving unit 380.

The input driving unit 320 is configured to include a plurality of multiplexers to select the 8-bit parallel data GIO<0:7> of the corresponding bank in response to the bank information signals BANK_EV and BANK_OD to output mux-output data MX01R to MX67R and MX01F to MX67F.

The data latch unit 340 is configured to latch the mux-output data MX01R to MX67R and MX01F to MX67F in response to the pipe latch input control signal PIN.

The data selection unit 350 is configured to selectively output the latched data as latch-output data DO01R to DO67R and DO01F to DO67F in response to the selection signal SOSEB0.

The data alignment unit 360 is configured to determine a read burst order. The data alignment unit 360 aligns the latch-output data DO01R to DO67R and DO01F to DO67F in response to the even and odd alignment control signal groups ORDER_R<0:3> and ORDER_F<0:3> to output first and second alignment-output data ARDO and AFDO.

In more detail, the data alignment unit 360 includes an even data alignment unit 360A and an odd data alignment unit 360B. The even data alignment unit 360A aligns the latch-output data DO01R to DO67R in response to the even alignment control signal group ORDER_R<0:3> to output the first alignment-output data ARDO. The odd data alignment unit 360B aligns the latch-output data DO01F to DO67F in response to the odd alignment control signal group ORDER_F<0:3> to output the second alignment-output data AFDO.

The output driving unit 380 is configured to output the first and second alignment-output data ARDO and AFDO as the first and second pipe-output data RDO and FDO in response to the first and second pipe latch output control signals FPOUT and RPOUT.

Figure 4A:
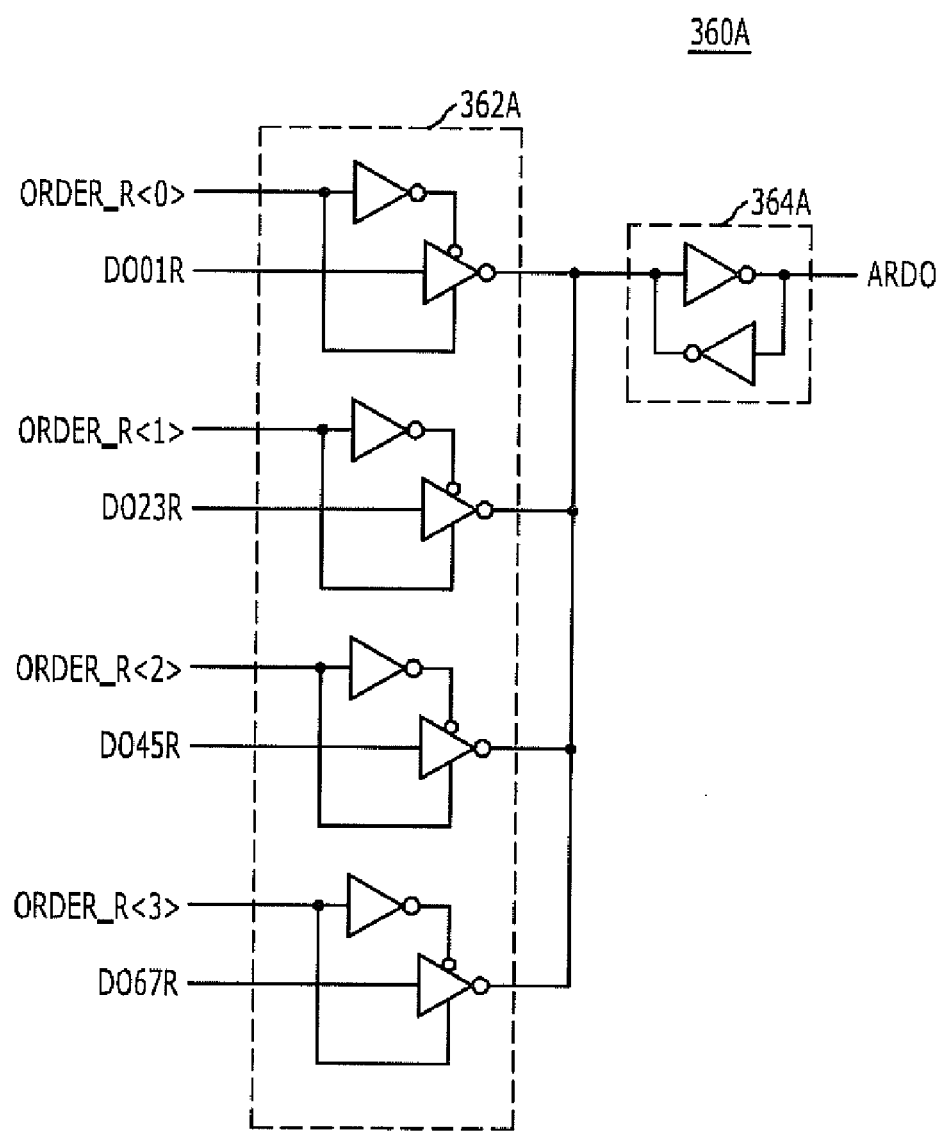
FIGS. 4A and 4B illustrate circuit diagrams of even and odd data alignment units shown in FIG. 3.

FIG. 4A illustrates a circuit diagram of the even data alignment unit 360A shown in FIG. 3.

Referring to FIG. 4A, the even data alignment unit 360A includes a 1-stage multiplexing unit 362A and a latch unit 364A. The 1-stage multiplexing unit 362A selects one of the multi latch-output data DO01R to DO67R in response to the even alignment control signal group ORDER_R<0:3> to output the first alignment-output data ARDO.

The 1-stage multiplexing unit 362A includes a plurality of unit multiplexers corresponding to the number of signals of the even alignment control signal group ORDER_R<0:3>. Each unit multiplexer outputs a corresponding one of the latch-output data DO01R to DO67R as the first alignment-output data ARDO in response to a corresponding signal of the even alignment control signal group ORDER_R<0:3>. For example, when the number of signals of the even alignment control signal group ORDER_R<0:3> is 4, the 1-stage multiplexing unit 362A includes 4 unit multiplexers. In the preferred embodiment, the unit multiplexers are coupled in parallel in order to perform a 1-step multiplexing operation.

In more detail, the 1-stage multiplexing unit 362A may include a plurality of tri-state inverters configured to select one of the latch-output data DO01R to DO67R in response to the even alignment control signal group ORDER_R<0:3> to output the first alignment-output data ARDO.

Meanwhile, the latch unit 364A includes an inverter latch configured to latch an output of the 1-stage multiplexing unit 362A.

Figure 4B:
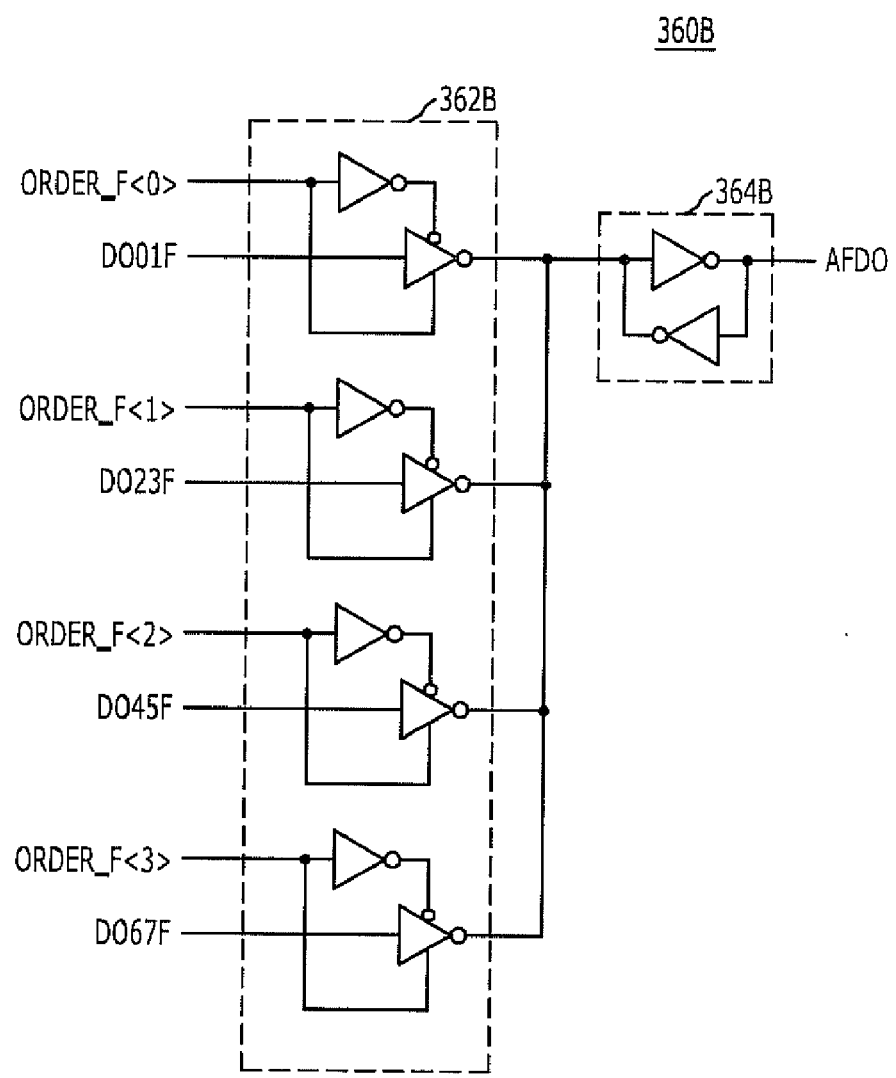

FIG. 4B illustrates a circuit diagram of the odd data alignment unit 360B shown in FIG. 3.

Referring to FIG. 4B, the odd data alignment unit 360B includes a 1-stage multiplexing unit 362B and a latch unit 364B. The 1-stage multiplexing unit 362B selects one of the latch-output data DO01F to DO67F in response to the odd alignment control signal group ORDER_F<0:3> to output the second alignment-output data AFDO.

The 1-stage multiplexing unit 362B includes a plurality of unit multiplexers corresponding to the number of signals of the odd alignment control signal group ORDER_F<0:3>. Each unit multiplexer outputs a corresponding one of the latch-output data DO01F to DO67F as the second alignment-output data AFDO in response to a corresponding signal of the odd alignment control signal group ORDER_F<0:3>. For example, when the number of signals of the odd alignment control signal group ORDER_F<0:3> is 4, the 1-stage multiplexing unit 362B includes 4 unit multiplexers. In the preferred embodiment, the unit multiplexers are coupled in parallel in order to perform a 1-step multiplexing operation.

In more detail, the 1-stage multiplexing unit 362B may include a plurality of tri-state inverters configured to select one of the latch-output data DO01F to DO67F in response to the odd alignment control signal group ORDER_F<0:3> to output the second alignment-output data AFDO.

Meanwhile, the latch unit 364B includes an inverter latch configured to latch an output of the 1-stage multiplexing unit 362B.

As described above, the known data output circuit performs a 2-step multiplexing operation in response to the alignment control signals SOSEB1_R, SOSEB2_R, SOSEB1_F, and SOSEB2_F. On the contrary, the data output circuit of the present embodiment performs a 1-step multiplexing operation in response to the alignment control signal groups ORDER_R<0:3> and ORDER_F<0:3>. Accordingly, the likelihood of an asynchronous path and a skew thereof may be minimized/reduced.

Hereinafter, in order to perform the 1-step multiplexing operation, a method for generating the alignment control signal groups ORDER_R<0:3> and ORDER_F<0:3> by decoding the seed address group A<0:2> is described.

A synchronous memory device latches data stored in a cell array block to a pipe latch in response to the read command, and then, outputs the data latched in the pipe latch after a column access strobe (CAS) latency CL. Therefore, the data can be output without a data collision when the commands are input consecutively.

When data having a plurality of bits are output in response to a single read command, the bit number of the output data is determined by setting a burst length of a mode register set (MRS). Further, a sequence of the output data is determined by setting a burst type of the MRS, which is classified into a sequential type and an interleave type. The sequential type and the interleave type have different data output orders.

Referring to Table 1, the synchronous memory device determines the sequence of the output data according to the seed address and the burst type, i.e., the sequential type or the interleave type, during a read operation. Table 1 shows the sequence of the output data depending on the seed address for both the sequential type and interleave type.

TABLE 1

| Seed Address | | | Sequential Type | | | | | | | | Interleave Type | | | | | | | |
|---|---|---|---|---|---|---|---|---|---|---|---|---|---|---|---|---|---|---|
| A2 | A1 | A0 | R | F | R | F | R | F | R | F | R | F | R | F | R | F | R | F |
| 0 | 0 | 0 | 0 | 1 | 2 | 3 | 4 | 5 | 6 | 7 | 0 | 1 | 2 | 3 | 4 | 5 | 6 | 7 |
| 0 | 0 | 1 | 1 | 2 | 3 | 0 | 5 | 6 | 7 | 4 | 1 | 0 | 3 | 2 | 5 | 4 | 7 | 6 |
| 0 | 1 | 0 | 2 | 3 | 0 | 1 | 6 | 7 | 4 | 5 | 2 | 3 | 0 | 1 | 6 | 7 | 4 | 5 |

TABLE 1-continued

| Seed Address | | | Sequential Type | | | | | | | | Interleave Type | | | | | | |
|---|---|---|---|---|---|---|---|---|---|---|---|---|---|---|---|---|---|
| A2 | A1 | A0 | R | F | R | F | R | F | R | F | R | F | R | F | R | F | |
| 0 | 1 | 1 | 3 | 0 | 1 | 2 | 7 | 4 | 5 | 6 | 3 | 2 | 1 | 0 | 7 | 6 | 5 | 4 |
| 1 | 0 | 0 | 4 | 5 | 6 | 7 | 0 | 1 | 2 | 3 | 4 | 5 | 6 | 7 | 0 | 1 | 2 | 3 |
| 1 | 0 | 1 | 5 | 6 | 7 | 4 | 1 | 2 | 3 | 0 | 5 | 4 | 7 | 6 | 1 | 0 | 3 | 2 |
| 1 | 1 | 0 | 6 | 7 | 4 | 5 | 2 | 3 | 0 | 1 | 6 | 7 | 4 | 5 | 2 | 3 | 0 | 1 |
| 1 | 1 | 1 | 7 | 4 | 5 | 6 | 3 | 0 | 1 | 2 | 7 | 6 | 5 | 4 | 3 | 2 | 1 | 0 |

Table 2 displays the sequence of the output data in a different manner than Table 1. Table 2 represents the sequence of the output data classified according to an even timing (a rising timing) and an odd timing (a falling timing).

TABLE 2

| | Seed Address | | | Sequential Type | | | | Interleave Type | | | |
|---|---|---|---|---|---|---|---|---|---|---|---|
| | | A0 | A2 | A1 | | | | | | | | |
| Rising timing | A0 = L | 0 | 0 | 0 | 1 | 2 | 3 | 0 | 1 | 2 | 3 |
| | A0 = H | 0 | 0 | 0 | 1 | 2 | 3 | 0 | 1 | 2 | 3 |
| | A0 = L | 0 | 1 | 1 | 0 | 3 | 2 | 1 | 0 | 3 | 2 |
| | A0 = H | 0 | 1 | 1 | 0 | 3 | 2 | 1 | 0 | 3 | 2 |
| | A0 = L | 1 | 0 | 2 | 3 | 0 | 1 | 2 | 3 | 0 | 1 |
| | A0 = H | 1 | 0 | 2 | 3 | 0 | 1 | 2 | 3 | 0 | 1 |
| | A0 = L | 1 | 1 | 3 | 2 | 1 | 0 | 3 | 2 | 1 | 0 |
| | A0 = H | 1 | 1 | 3 | 2 | 1 | 0 | 3 | 2 | 1 | 0 |
| falling timing | A0 = L | 0 | 0 | 0 | 1 | 2 | 3 | 0 | 1 | 2 | 3 |
| | A0 = H | 0 | 0 | 1 | 0 | 3 | 2 | 0 | 1 | 2 | 3 |
| | A0 = L | 0 | 1 | 1 | 0 | 3 | 2 | 1 | 0 | 3 | 2 |
| | A0 = H | 0 | 1 | 0 | 1 | 2 | 3 | 1 | 0 | 3 | 2 |
| | A0 = L | 1 | 0 | 2 | 3 | 0 | 1 | 2 | 3 | 0 | 1 |
| | A0 = H | 1 | 0 | 3 | 2 | 1 | 0 | 2 | 3 | 0 | 1 |
| | A0 = L | 1 | 1 | 3 | 2 | 1 | 0 | 3 | 2 | 1 | 0 |
| | A0 = H | 1 | 1 | 2 | 3 | 0 | 1 | 3 | 2 | 1 | 0 |

Referring to Table 2, in case of the even timing (the rising timing), the second and third seed addresses A<1:2> determine the burst order of the output data according to a first seed address A<0> and the burst type, i.e., the sequential type or the interleave type. In case of the odd timing (the falling timing), the burst order of the output data is the same as that of the even timing (the rising timing) when the burst type is the interleave type, while the burst order of the output data is different from the even timing (the rising timing) when the burst type is the sequential type. More specifically, in case of the sequential type, the burst order of two adjacent output data is swapped when the first seed address A<0> is set to a logic high level. In more detail, when the first seed address A<0> has a logic high level, the burst order of first and second output data is swapped and the burst order of third and fourth output data is swapped.

Figure 5B:
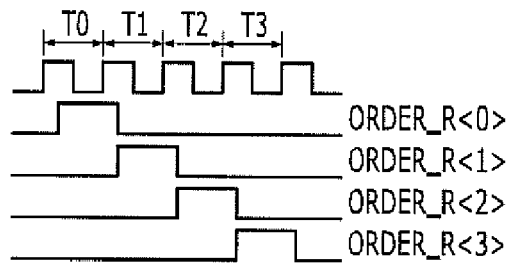
Figure 5B:
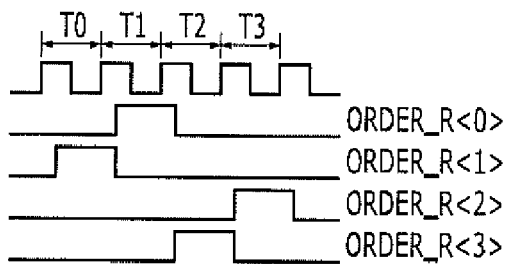
Figure 5B:
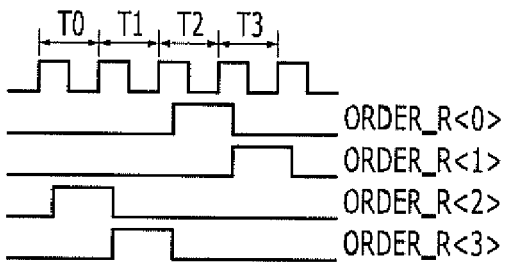
Figure 5B:
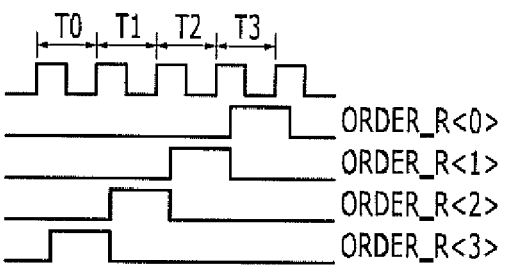

FIGS. 5A and 5B are diagrams illustrating the even alignment control signal group ORDER_R<0:3> and the odd alignment control signal group ORDER_F<0:3> to be generated in response to the seed addresses.

FIG. 5A shows output data P0 to P3 to be output at a corresponding output timing T0 to T3 according to seed address cases S0 to S3 based on Table 2. FIG. 5B shows the even alignment control signal group ORDER_R<0:3> to be generated at the corresponding output timing T0 to T3 according to the seed address cases S0 to S3. Here, each of the seed address cases S0 to S3 denotes when the seed addresses A<1:2> are "00", "01", "10" and "11", respectively. Hereinafter, a case in which the burst type is set to the sequential type and the first seed address A<0> has a logic high level at an odd timing (a falling timing) is referred to as "a swap mode".

Referring to FIG. 5A, in a normal mode, that is a mode except for the swap mode, a burst order of the output data is set to a certain sequence (e.g., a predetermined sequence) according to the seed address cases S0 to S3. In the swap mode, a burst order of the output data is swapped, so that the burst order is different than that of a corresponding sequence. In more detail, in the swap mode, the burst order differs from the sequences corresponding to seed address cases S0 to S3, such that the first and second output data P0 and P1 are selectively swapped and the third and fourth output data P2 and P3 are selectively swapped. Accordingly, in the preferred embodiment, the odd alignment control signal group ORDER_F<0:3> is generated to have the same data as that of the even alignment control signal group ORDER_R<0:3> in the normal mode, while the odd alignment control signal group ORDER_F<0:3> is generated by swapping adjacent data of the even alignment control signal group ORDER_R<0:3> in the swap mode.

In the normal mode the even alignment control signal group ORDER_R<0:3> is generated as shown in FIG. 5B, and the odd alignment control signal group ORDER_F<0:3> is also generated to have the same data as that of the even alignment control signal group ORDER_R<0:3>. For example, in the seed address case S1, the second output data P1 is output at the output timing T0, the first output data P0 is output at the output timing T1, the fourth output data P3 is output at the output timing T2, the third output data P2 is output at the output timing T3. As a result, the even alignment control signal group ORDER_R<0:3> is activated in the following sequence in order starting with the earliest: ORDER_R<1>, ORDER_R<0>, ORDER_R<3>, and ORDER_R<2>. Meanwhile, the odd alignment control signal group ORDER_F<0:3> is also activated in the following sequence in order starting with the earliest: ORDER_F<1>, ORDER_F<0>, ORDER_F<3>, and ORDER_F<2>.

In the swap mode, the even alignment control signal group ORDER_R<0:3> is generated as shown in FIG. 5B, and the odd alignment control signal group ORDER_F<0:3> is generated by swapping adjacent data of the even alignment control signal group ORDER_R<0:3>. For example, in the seed address case S1, the even alignment control signal group ORDER_R<0:3> is activated in the following sequence in order starting with the earliest: ORDER_R<1>, ORDER_R<0>, ORDER_R<3>, and ORDER_R<2>. Meanwhile, first and second even alignment control signals ORDER_R<0> and ORDER_R<1> are swapped to output first and second odd alignment control signals ORDER_F<0> and ORDER_F<1>, and third and fourth even alignment control signals ORDER_R<2> and ORDER_R<3> are swapped to output third and fourth odd alignment control signals ORDER_F<2> and ORDER_F<3>. As a result, in the seed address case S1, the odd alignment control signal group ORDER_F<0:3> is activated in the following sequence in order starting with the earliest: ORDER_R<0>, ORDER_R<1>, ORDER_R<2>, and ORDER_R<3>.

Hereinafter, the alignment control signal generating unit 200 for generating the alignment control signal groups ORDER_R<0:3> and ORDER_F<0:3> is described in more detail.

Figure 6:
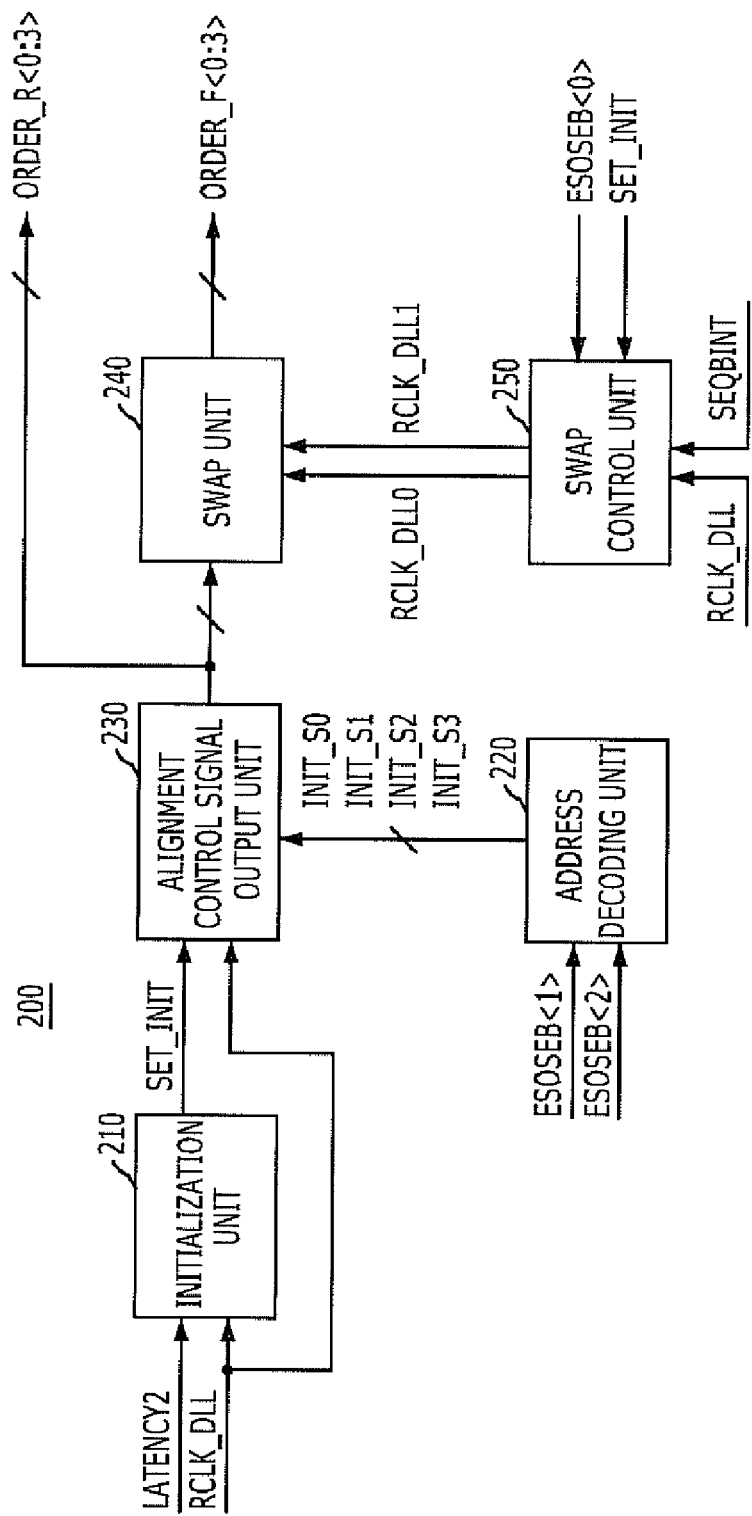
FIG. 6 illustrates a block diagram of an alignment control signal generating unit in accordance with an embodiment of the present invention.

FIG. 6 illustrates a block diagram of the alignment control signal generating unit 200 in accordance with an embodiment of the present invention.

As shown, the alignment control signal generating unit 200 in accordance with the embodiment includes an initialization unit 210, an address decoding unit 220, an alignment control signal output unit 230, a swap unit 240, and a swap control unit 250.

The initialization unit 210 is configured to generate an initialization signal SET_INT for resetting the alignment control signal output unit 230 at an initial timing. The initial timing is determined in response to the CAS latency signal LATENCY2, which is activated at a certain time with respect to the CAS latency CL, and the DLL rising clock signal RCLK_DLL. When the certain time of the CAS latency CL is set to CL minus two (CL−2) timing, the initialization signal SET_INT is activated at a CL minus one (CL−1) timing.

The address decoding unit 220 is configured to generate a plurality of initial value setting signals INIT_S0 to INIT_S3 by decoding clock-domain addresses ESOSEB<1:2>, which are generated by synchronizing the seed addresses A<1:2> to a DLL clock domain.

The alignment control signal output unit 230 is configured to be initialized in response to the initialization signal SET_INT, and set initial values based on the initial value setting signals INIT_S0 to INIT_S3. The alignment control signal output unit 230 is further configured to sequentially output the set values as the even alignment control signal group ORDER_R<0:3> whenever the DLL rising clock signal RCLK_DLL transits.

The swap control unit 250 is configured to receive the burst-type selection signal SEQBINT, a clock-domain address ESOSEB<0>, the initialization signal SET_INT, and the DLL rising clock signal RCLK_DLL to generate first and second swap control signals RCLK_DLL0 and RCLK_DLL1 for controlling a swap operation of the swap unit 240. Here, the clock-domain address ESOSEB<0> is generated by synchronizing the first seed address A<0> to the clock domain.

The swap unit 240 is configured to receive the even alignment control signal group ORDER_R<0:3>, and to output the odd alignment control signal group ORDER_F<0:3> by selectively performing a swap operation on the even alignment control signal group ORDER_R<0:3> in response to the first and second swap control signals RCLK_DLL0 and RCLK_DLL1.

Figure 7:
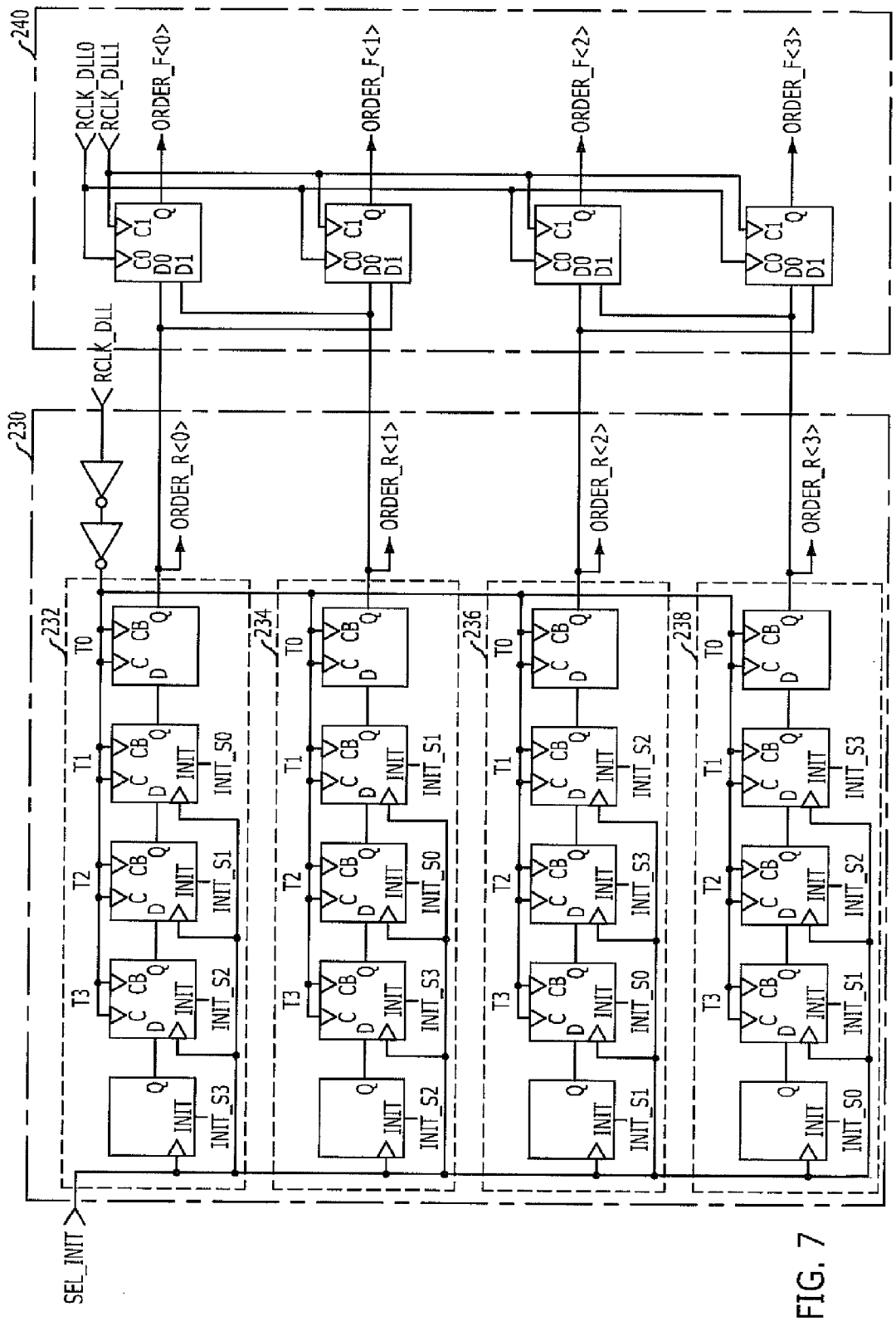
FIG. 7 illustrates a circuit diagram of an alignment control signal output unit and a swap unit shown in FIG. 6.

FIG. 7 illustrates a circuit diagram of the alignment control signal output unit 230 and the swap unit 240 shown in FIG. 6.

As shown in FIG. 7, the alignment control signal output unit 230 includes first to fourth signal generators 232 to 238.

The first signal generator 232 is configured to include a plurality of D flip-flops, which are set to the initial value setting signals INIT_S0 to INIT_S3. The D flip-flops provided in the first signal generator 232 are set to the initial value setting signals in the following sequence in order starting with the earliest: INIT_S0, INIT_S2, and INIT_S3. The D flip-flops provided in the first signal generator 232 are initialized in response to the initialization signal SET_INT, and sequentially output the set values as the first even alignment control signal ORDER_R<0> in synchronism with the DLL rising clock signal RCLK_DLL.

The second signal generator 234 is configured to include a plurality of D flip-flops, which are set to the initial value setting signals INIT_S0 to INIT_S3. The D flip-flops provided in the second signal generator 234 are set to the initial value setting signals in the following sequence in order starting with the earliest: INIT_µl, INIT_S0, INIT_S3, and INIT_S2. The D flip-flops provided in the second signal generator 234 are initialized in response to the initialization signal SET_INT, and sequentially output the set values as the second even alignment control signal ORDER_R<1> in synchronism with the DLL rising clock signal RCLK_DLL.

The third signal generator 236 is configured to include a plurality of D flip-flops, which are set to the initial value setting signals INIT_S0 to INIT_S3. The D flip-flops provided in the third signal generator 236 are set to the initial value setting signals in the following sequence in order starting with the earliest: INIT_S2, INIT_S3, INIT_S0, and INIT_S1. The D flip-flops provided in the third signal generator 236 are initialized in response to the initialization signal SET_INT, and sequentially output the set values as the third even alignment control signal ORDER_R<2> in synchronism with the DLL rising clock signal RCLK_DLL.

The fourth signal generator 238 is configured to include a plurality of D flip-flops, which are set to the initial value setting signals INIT_S0 to INIT_S3. The D flip-flops provided in the fourth signal generator 238 are set to the initial value setting signals in the following sequence in order starting with the earliest: INIT_S3, INIT_S2, INIT_S1, and INIT_S0. The ID flip-flops provided in the fourth signal generator 238 are initialized in response to the initialization signal SET_INT, and sequentially output the set values as the fourth even alignment control signal ORDER_R<3> in synchronism with the DLL rising clock signal RCLK_DLL.

The swap unit 240 is configured to receive the even alignment control signal group ORDER_R<0:3> from the first to fourth signal generators 232 to 238, and to output the odd alignment control signal group ORDER_F<0:3> by selectively performing a swap operation in response to the first and second swap control signals RCLK_DLL0 and RCLK_DLL1.

In the normal mode, the swap unit 240 outputs the even alignment control signal group ORDER_R<0:3> as the odd alignment control signal group ORDER_F<0:3> in response to the activated first swap control signal RCLK_DLL0. In the swap mode, in response to the activated second swap control signal RCLK_DLL1, the swap unit 240 swaps the first even alignment control signal ORDER_R<0> with the second even alignment control signal ORDER_R<1> to output the first and second odd alignment control signals ORDER_F<0> and ORDER_F<1>, and swaps the third even alignment control signal ORDER_R<2> with the fourth even alignment control signal ORDER_R<3> to output the third and fourth odd alignment control signals ORDER_F<2> and ORDER_F<3>.

The swap unit 240 may be implemented with a plurality of multiplexers. For example, the swap unit 240 may include a number of multiplexers, where the number of multiplexers corresponds to the number of the odd alignment control signals. Further, for example, as shown in FIG. 7, each multiplexer may receive two of the even alignment control signals ORDER_R<0:3> and output one of the odd alignment control signals ORDER_F<0:3>.

Figure 8:
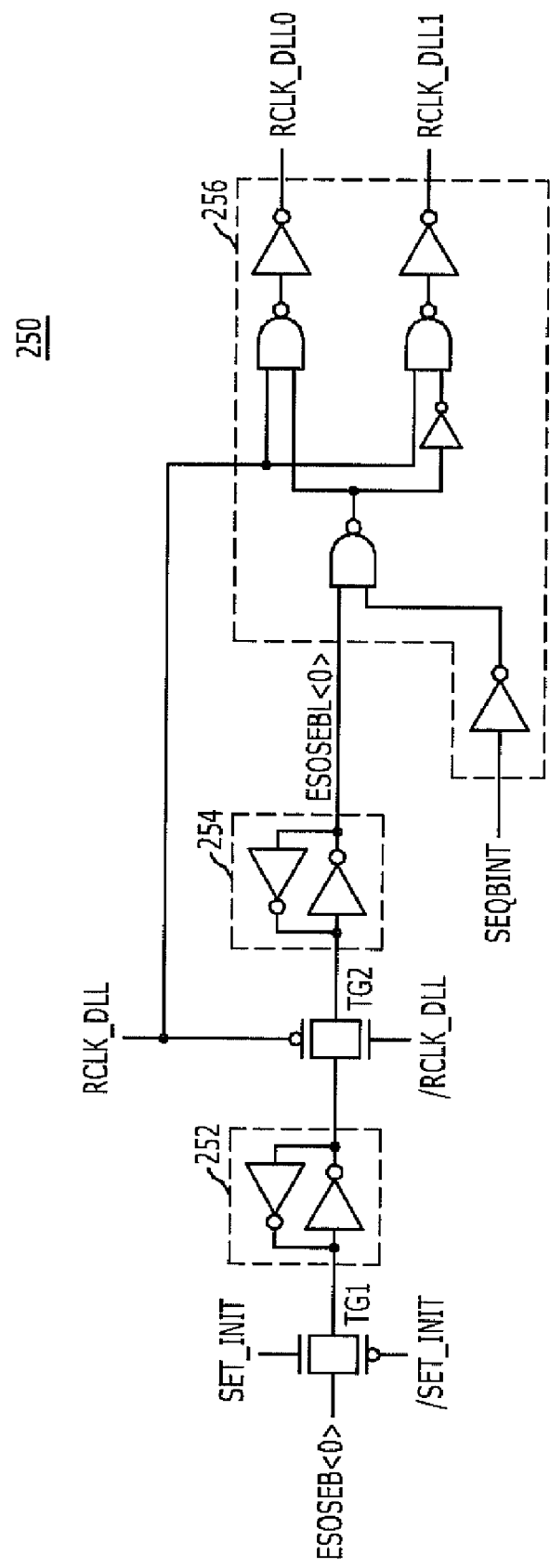
FIG. 8 illustrates a circuit diagram of a swap control unit shown in FIG. 6.

FIG. 8 illustrates a circuit diagram of the swap control unit 250 shown in FIG. 6.

In the preferred embodiment, the alignment control signal generating unit is in the swap mode when the burst type is set to the sequential type, and the first seed address A<0> has a logic high level at the odd timing (the falling timing). To detect the swap mode, the swap control unit 250 of the preferred embodiment is configured to receive the burst-type selection signal SEQBINT having a logic low level when the burst type is set to the sequential type, the clock-domain address ESOSEB<0> including information on the first seed address A<0>, and the DLL rising clock signal RCLK_DLL to detect the odd timing (the falling timing). As a result, the swap control unit 250 may output the first and second swap control signals RCLK_DLL0 and RCLK_DLL1 in order to selectively perform the swap operation according to whether the swap mode is detected or not.

Referring to FIG. 8, the swap control unit 250 latches the clock-domain address ESOSEB<0> at a CL minus one (CL−1) timing in response to the initialization signal SET_INIT, synchronizes the is latched address with the DLL rising clock signal RCLK_DLL at a CL minus one-half (CL−0.5) timing, and performs a logic operation on the synchronized latched address and the burst-type selection signal SEQBINT to thereby activate one of the first and second swap control signals RCLK_DLL0 and RCLK_DLL1 at a CL timing. As described above, the present embodiment may improve a tCK margin by minimizing the number of gate logic to be passed during half of a period of a clock. Herein, the tCK represents a period of an external clock signal.

In more detail, the swap control unit 250 of the preferred embodiment includes a first transfer gate TG1, a first latch 252, a second transfer gate TG2, a second latch 254, and a logic operation unit 256.

The first transfer gate TG1 is configured to transfer the clock-domain address ESOSEB<0> in response to the initialization signal SET_INIT, and the first latch 252 is configured to latch an output of the first transfer gate TG1. The second transfer gate TG2 is configured to transfer the latched address in response to the DLL rising clock signal RCLK_DLL. The second latch 254 is configured to latch an output of the second transfer gate TG2, and to output an intermediate signal ESOSEBL<0>. The logic operation unit 256 is configured to perform a logic operation on the intermediate signal ESOSEBL<0> and the burst-type selection signal SEQBINT based on the DLL rising clock signal RCLK_DLL to thereby activate and output one of the first and second swap control signals RCLK_DLL0 and RCLK_DLL1.

In the swap mode, the clock-domain address ESOSEB<0>, generated by synchronizing the first seed address A<0> with the clock domain, becomes a logic high level. Meanwhile, the burst-type selection signal SEQBINT becomes a logic low level when the burst type is set to the sequential type. Accordingly, based on the intermediate signal ESOSEBL<0> of the logic high level and the burst-type selection signal SEQBINT of the logic low level, the first swap control signal RCLK_DLL0 is output to a logic low level and the second swap control signal RCLK_DLL1 is output to have substantially the same waveform as the DLL rising clock signal RCLK_DLL.

In the normal mode, the clock-domain address ESOSEB<0> becomes a logic low level, and thus, the intermediate signal ESOSEBL<0> has a logic low level. Accordingly, based on the intermediate signal ESOSEBL<0> of the logic low level, the second swap control signal RCLK_DLL1 is output to a logic low level and the first swap control signal RCLK_DLL0 is output to have substantially the same waveform as the DLL rising clock signal RCLK_DLL.

Figure 9:
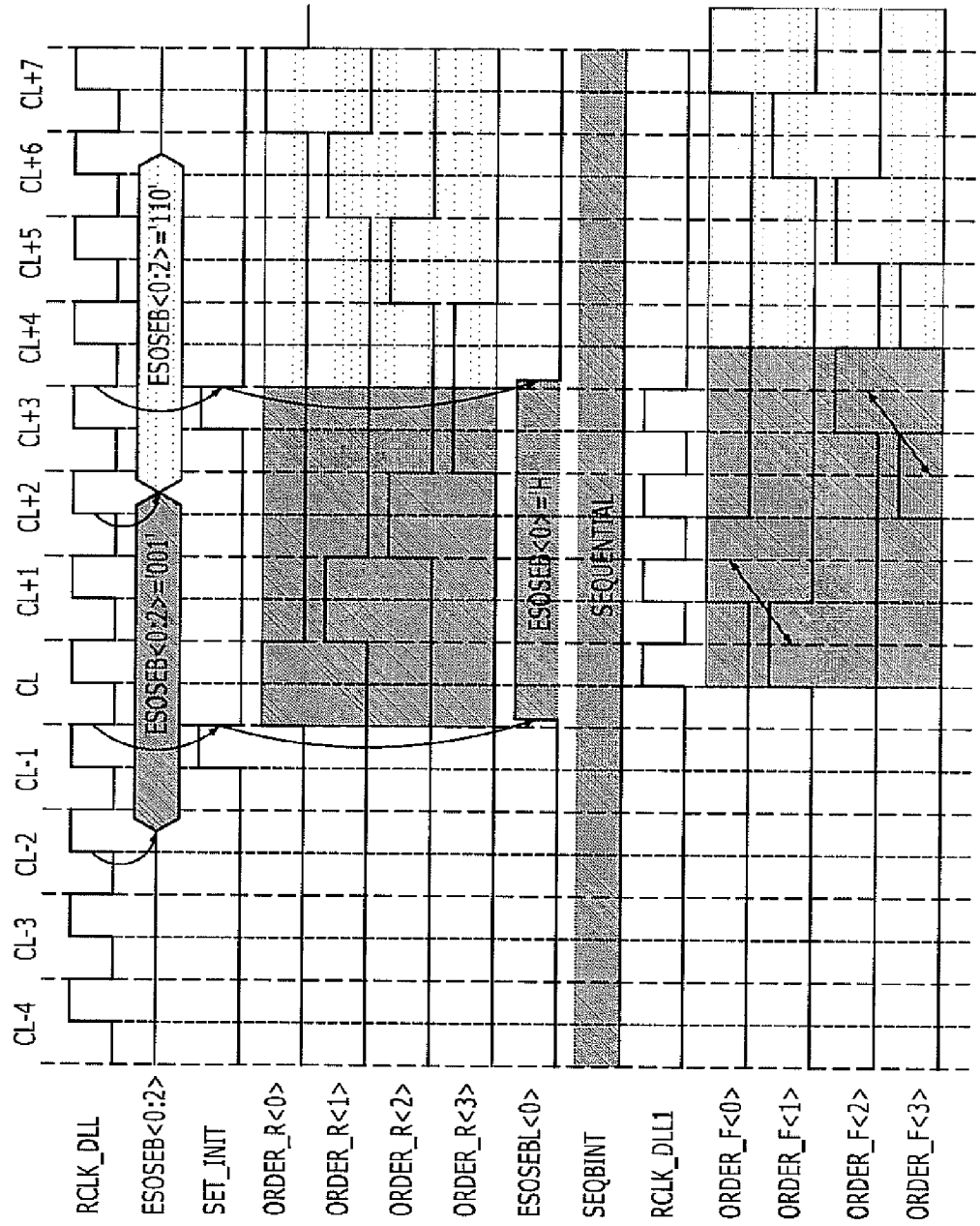
FIG. 9 is a waveform diagram illustrating an operation of the alignment control signal generating unit shown in FIG. 6.

FIG. 9 is a waveform diagram illustrating an operation of the alignment control signal generating unit 200 shown in FIG. 6.

As shown in FIG. 9, the burst type is set to the sequential type, and two read operations are performed consecutively. It is assumed that the seed address group A<0:2> input during a first read operation is "001", and the seed address group A<0:2> input during a second read operation is "110".

In the first read operation, the clock-domain addresses ESOSEB<0:2>, which are generated by synchronizing the seed address group A<0:2> to the clock domain, and the CAS latency signal LATENCY2 are input at a CL minus two (CL−2) timing. The initialization unit 210 generates the initialization signal SET_INIT and the address decoding unit 220 generates the initial value setting signals INIT_S0 to INIT_S3 by decoding clock-domain addresses ESOSEB<1:2>. Accordingly, the alignment control signal output unit 230 is initialized in response to the initialization signal SET_INIT, and sets initial values based on the initial value setting signals INIT_S0 to INIT_S3. The alignment control signal output unit 230 sequentially outputs the set initial values as the even alignment control signal group ORDER_R<0:3> whenever the DLL rising clock signal RCLK_DLL transits.

Thereafter, the swap control unit 250 outputs the intermediate signal ESOSEBL<0> to a logic high level at a CL minus one-half (CL−0.5) timing in synchronism with the initialization signal SET_INT and the DLL rising clock signal RCLK_DLL. As a result, the second swap control signal RCLK_DLL1 is output to have substantially the same waveform as the DLL rising clock signal RCLK_DLL by combining the clock-domain address ESOSEB<0> of a logic high level with the burst-type selection signal SEQBINT of a logic low level for the sequential type. Accordingly, the swap unit 240 swaps the first and second even alignment control signals ORDER_R<0> and ORDER_R<1> to output the first and second odd alignment control signals ORDER_F<0> and ORDER_F<1>, and swaps the third and fourth even alignment control signals ORDER_R<2> and ORDER_R<3> to output the third and fourth odd alignment control signals ORDER_F<2> and ORDER_F<3>.

In the second read operation, since the clock-domain address ESOSEB<0> has a logic low level, the swap unit 240 outputs the odd alignment control signal group ORDER_F<0:3> to have substantially the same waveform as the even alignment control signal group ORDER_R<0:3>.

Figure 10:
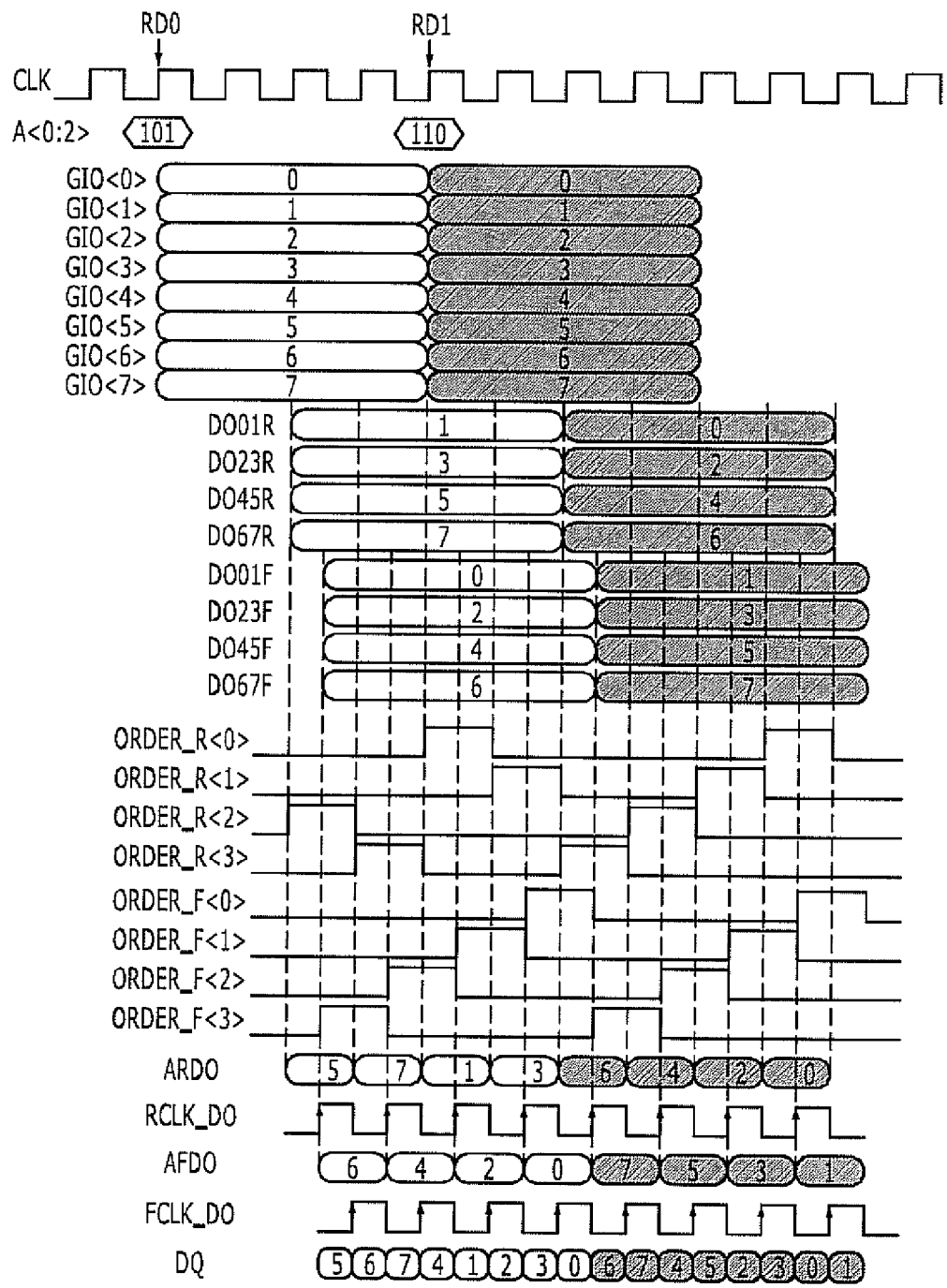
FIG. 10 is a waveform diagram illustrating a burst order of output data from a semiconductor memory device in accordance with an embodiment of the present invention.

FIG. 10 is a waveform diagram illustrating a burst order of output data from a semiconductor memory device in accordance with an embodiment of the present invention.

As shown in FIG. 10, the burst type is set to the sequential type, and two read operations are performed consecutively. It is assumed that the seed address group A<0:2> input during a first read operation is "101", and the seed address group A<0:2> input during a second read operation is "110".

Hereinafter, the burst order of the output data from the semiconductor memory device is described in more detail with reference to the pipe latch unit 300 of FIG. 3 and the alignment control signal generating unit 200 of FIG. 6.

After the 8-bit parallel data GIO<0:7> are transferred to the pipe latch unit 300, the latch-output data DO01R to 0067R and DO01F to DO67F of a corresponding bank are output from the data selection unit 350. Then, the data alignment unit 360 aligns the latch-output data DO01R to DO67R and DO01F to DO67F in response to the even and odd alignment control signal groups ORDER_R<0:3> and ORDER_F<0:3> to output the first and second alignment-output data ARDO and AFDO.

In the first read operation, since the burst type is the sequential type and the first seed address A<0> has a logic high level, the swap operation is performed in the swap mode. Since the second swap control signal RCLK_DLL1 is activated, the odd alignment control signal group ORDER_F<0:3> is output by swapping the even alignment control signal group ORDER_R<0:3>. That is, the even latch-output data DO01R to DO67R are aligned and output as the first alignment-output data ARDO in the following sequence in order starting with the earliest: D045R, DO67R, DO01R, and D023R. This sequence corresponds to a burst order where the seed addresses <1:2> is "10" (i.e., 2→3→0→1). Further, the odd latch-output data DO01F to DO67F are aligned and output as the second alignment-output data AFDO in the following sequence in order starting with the earliest: DO67F, D045F, D023F, and DO01F. This sequence corresponds to a swapped burst order where the seed addresses <1:2> is "10" (i.e., 3→2→1→0). Finally, the first and second alignment-output data ARDO and AFDO are alternatively output as the output data DQ in synchronism with output clock signals RCLK_DO and FCLK_DO.

In the second read operation, since the first seed address A<0> has a logic low level, the semiconductor memory device is in the normal mode (i.e., not a swap mode), and therefore, the swap operation is not performed. Since the first swap control signal RCLK_DLL0 is activated, the even alignment control signal group ORDER_R<0:3> is output as the odd alignment control signal group ORDER_F<0:3>. That is, the even latch-output data DO01R to DO67R are aligned and output as the first alignment-output data ARDO in the following sequence in order starting with the earliest: DO67R, D045R, D023R, and DO10R. This sequence corresponds to a burst order where the seed addresses <1:2> is "11" (i.e., 3→2→1→0). Further, the odd latch-output data DO01F to DO67F are aligned and output as the second alignment-output data AFDO in the following sequence in order starting with the earliest: DO67F, D045F, D023F, and DO01F. This sequence is the same as the sequence of the even latch-output data DO01R to DO67R. Finally, the first and second alignment-output data ARDO and AFDO are alternatively output as the output data DQ in synchronism with the output clock signals RCLK_DO and FCLK_DO.

As described above, in accordance with the exemplary embodiments of the present invention, a semiconductor memory device generates an alignment control signal by decoding a seed address to implement a data alignment unit for determining a read burst order with a 1-stage multiplexer. As a result, the likelihood of an asynchronous path and a skew thereof can be reduced/minimized, and thus, the synchronous memory device can be prevented from malfunctioning by improving a tAA.

Further, in accordance with the exemplary embodiments of the present invention, a semiconductor memory device can improve a data transfer rate by simplifying a structure of a data alignment unit and reducing/minimizing the stage-number of gates thereof.

In accordance with the exemplary embodiments of the present invention, a semiconductor memory device can improve a tCK margin by implementing an alignment signal generating unit with plural flip-flops.

While the present invention has been described with respect to specific embodiments, it will be apparent to those skilled in the art that various changes and modifications may be made without departing from the spirit and scope of the present invention as defined by the following claims.

What is claimed is:

1. A data output circuit of a semiconductor memory device, comprising:
    a pipe latch unit configured to store input parallel data and align the stored data in response to a plurality of alignment control signals to output serial output data; and
    an alignment control signal generating unit configured to generate the plurality of alignment control signals in response to a burst-type information and a seed address group,
    wherein the alignment control signal generating unit generates the alignment control signals to swap data in a swap mode where the burst-type is a certain type and bits of the seed address group are certain values.

2. The data output circuit of claim 1, wherein the pipe latch unit comprises a multiplexing unit including a plurality of unit multiplexers whose number corresponds to the number of the alignment control signals.

3. The data output circuit of claim 2, wherein the unit multiplexers are coupled in parallel to form the multiplexing unit with 1-stage.

4. The data output circuit of claim 1, wherein the seed address group includes some bits of a column address supplied with a read command during a read operation.

5. The data output circuit of claim 1, wherein the swap mode includes a case in which the burst-type is set to a sequential type and a first signal of the seed address group has a first logic level at a falling timing of a clock signal.

6. The data output circuit of claim 1, wherein the alignment control signal generating unit comprises:
    an address decoding unit configured to generate a plurality of initial value setting signals by decoding second and third signals of the seed address group;
    an alignment control signal output unit configured to set initial values based on the initial value setting signals, and sequentially output the set initial values as the alignment control signals whenever a clock signal transits;
    a swap control unit configured to receive a burst-type selection signal, a first signal of the seed address group, and the clock signal to generate a swap control signal, which is enabled in the swap mode; and
    a swap unit configured to selectively perform a swap operation on the alignment control signals for swapping the data in the swap mode in response to the swap control signal.

7. The data output circuit of claim 6, wherein the alignment control signal generating unit further comprises an initialization unit configured to generate an initialization signal for resetting the alignment control signal output unit at an initial timing.

8. The data output circuit of claim 7, wherein the initial timing is determined in response to a column access strobe (CAS) latency signal activated at a certain time with respect to a CAS latency, and the clock signal.

9. The data output circuit of claim 7, wherein the alignment control signal output unit comprises a plurality of signal generators whose number corresponds to the number of the alignment control signals, wherein each of the signal generators comprises a plurality of D flip-flops configured to set initial values based on the initial value setting signals and sequentially output the set initial values as the alignment control signals whenever the clock signal transits.

10. The data output circuit of claim 7, wherein the swap control unit generates the swap control signal by latching the first signal of the seed address group in response to the initialization signal, synchronizing the latched first signal with the clock signal, and performing a logic operation on the synchronized latched first signal and the burst-type selection signal.

11. A data output circuit of a semiconductor memory device, comprising:
  a pipe latch unit configured to store input parallel data, and align even data of the stored data in response to a plurality of even alignment control signals to output a first output data, and align odd data of the stored data in response to a plurality of odd alignment control signals to output a second output data; and
  an alignment control signal generating unit configured to generate the plurality of even and odd alignment control signals in response to a burst-type information and a seed address group,
  wherein the alignment control signal generating unit outputs the even alignment control signals as the odd alignment control signals in a normal mode, and outputs the odd alignment control signals by swapping even alignment control signals in a swap mode.

12. The data output circuit of claim 11, wherein the pipe latch unit comprises:
  an even data alignment unit configured to align the even data of the stored data in response to the plurality of even alignment control signals to output the first output data; and
  an odd data alignment unit configured to align the odd data of the stored data in response to the plurality of odd alignment control signals to output the second output data.

13. The data output circuit of claim 12, wherein each of the even and odd data alignment units comprises:
  a multiplexing unit configured to select a corresponding one of the stored data to output the selected one as the first or second output data, the multiplexing unit including a plurality of unit multiplexers whose number corresponds to the number of the corresponding even or odd alignment control signals; and
  a latch unit configured to latch an output of the multiplexing unit.

14. The data output circuit of claim 13, wherein the unit multiplexers are coupled in parallel to form the multiplexing unit with 1-stage.

15. The data output circuit of claim 12, wherein the pipe latch unit further comprises:
  an input driving unit configured to receive and select the input parallel data of a corresponding bank according to bank information;
  a data latch unit configured to latch the selected parallel data in response to a pipe latch input control signal, and to output the latched parallel data to the even and odd data alignment units; and
  an output driving unit configured to synchronize the first and second output data, output from the even and odd data alignment units, with a pipe latch output control signal.

16. The data output circuit of claim 11, further comprising:
  a pipe latch output control unit configured to generate the pipe latch output control signal in response to a read column access strobe (CAS) signal, which is set by a read command; and
  a data driving unit configured to output the first and second output data of the pipe latch unit in synchronism with a clock signal.

17. The data output circuit of claim 11, wherein the alignment control signal generating unit comprises:
  an address decoding unit configured to generate a plurality of initial value setting signals by decoding second and third signals of the seed address group;
  an alignment control signal output unit configured to set initial values based on the initial value setting signals, and sequentially output the set initial values as the even and odd alignment control signals whenever a clock signal transits;
  a swap control unit configured to receive a burst-type selection signal, a first signal of the seed address group, and the clock signal to generate first and second swap control signals; and
  a swap unit configured to selectively perform a swap operation on the even alignment control signals to output the odd alignment control signals in response to the first and second swap control signals.

18. The data output circuit of claim 17, wherein the alignment control signal generating unit further comprises an initialization unit configured to generate an initialization signal for resetting the alignment control signal output unit at an initial timing.

19. The data output circuit of claim 18, wherein the initial timing is determined in response to a column access strobe (CAS) latency signal activated at a certain time with respect to a CAS latency, and the clock signal.

20. The data output circuit of claim 18, wherein the alignment control signal output unit comprises a plurality of signal generators whose number corresponds to the number of the even alignment control signals, wherein each of the signal generators comprises a plurality of D flip-flops configured to set initial values based on the initial value setting signals and sequentially output the set values as the even alignment control signals whenever the clock signal transits.

21. The data output circuit of claim 18, wherein the swap unit outputs the even alignment control signals as the odd alignment control signals when the first swap control signal is activated, and outputs the odd alignment control signals by swapping the even alignment control signals when the second swap control signal is activated.

22. The data output circuit of claim 18, wherein the swap control unit includes:
  a first transfer gate configured to transfer the first signal of the seed address group in response to the initialization signal;
  a first latch configured to latch an output of the first transfer gate;
  a second transfer gate configured to transfer an output of the first latch unit in response to the clock signal;
  a second latch configured to latch an output of the second transfer gate to output an intermediate signal; and
  a logic operation unit configured to perform a logic operation on the intermediate signal and the burst-type selection signal to activate the first swap control signal for the normal mode and activate the second swap control signal for the swap mode.

23. A data output circuit of a semiconductor memory device, comprising:
  a pipe latch output control unit configured to generate a pipe latch output control signal in response to a read column access strobe (CAS) signal, which is set by a read command;

an alignment control signal generating unit configured to generate a plurality of alignment control signals for swapping data in a swap mode detected in response to a burst-type information and a seed address group;
a pipe latch unit configured to store input parallel data and align the stored data in response to the plurality of alignment control signals to output serial output data; and
a data driving unit configured to output the serial output data of the pipe latch unit in synchronism with a clock signal.

24. The data output circuit of claim 23, wherein the pipe latch unit comprises a multiplexing unit including a plurality of unit multiplexers whose number corresponds to the number of the alignment control signals.

25. The data output circuit of claim 24, wherein the unit multiplexers are coupled in parallel to form the multiplexing unit with 1-stage.

* * * * *